(12) United States Patent
Kuo et al.

(10) Patent No.: US 7,655,938 B2
(45) Date of Patent: Feb. 2, 2010

(54) PHASE CHANGE MEMORY WITH U-SHAPED CHALCOGENIDE CELL

(76) Inventors: Charles C. Kuo, 33224 Arizona St., Union City, CA (US) 94587; Ilya V. Karpov, 4386 Lakeshore Dr., Santa Clara, CA (US) 95054

( * ) Notice: Subject to any disclaimer, the term of this patent is extended or adjusted under 35 U.S.C. 154(b) by 379 days.

(21) Appl. No.: 11/185,488

(22) Filed: Jul. 20, 2005

(65) Prior Publication Data

US 2007/0018148 A1    Jan. 25, 2007

(51) Int. Cl.
    *H01L 45/00*    (2006.01)
(52) U.S. Cl. .............................. 257/2; 257/49; 257/52; 257/E29.105; 257/E45.002; 365/148
(58) Field of Classification Search .................. 257/49, 257/52, E29.105
    See application file for complete search history.

(56) References Cited

U.S. PATENT DOCUMENTS

| | | | | |
|---|---|---|---|---|
| 5,296,716 A | * | 3/1994 | Ovshinsky et al. | 257/3 |
| 6,031,287 A | * | 2/2000 | Harshfield | 257/734 |
| 6,813,178 B2 | * | 11/2004 | Campbell et al. | 365/148 |
| 2002/0070379 A1 | * | 6/2002 | Dennison | 257/5 |
| 2003/0038301 A1 | * | 2/2003 | Moore | 257/200 |
| 2003/0155589 A1 | * | 8/2003 | Campbell et al. | 257/225 |
| 2004/0042316 A1 | * | 3/2004 | Lee et al. | 365/223 |
| 2004/0248339 A1 | * | 12/2004 | Lung | 438/102 |
| 2005/0019975 A1 | * | 1/2005 | Lee et al. | 438/95 |
| 2005/0185572 A1 | * | 8/2005 | Resta et al. | 370/205 |
| 2005/0285094 A1 | * | 12/2005 | Lee et al. | 257/2 |
| 2006/0001164 A1 | * | 1/2006 | Chang | 257/758 |
| 2007/0012905 A1 | * | 1/2007 | Huang | 257/2 |

OTHER PUBLICATIONS

Ha, Y.H. et al. "An Edge Contact Type Cell for Phase Change RAM Featuring Very Low Power Consumption." 2003 Symposium on VLSI Technology Digest of Technical Papers, pp. 175-176.*
Langhorst et al., "Low-Cost and Nanoscale Non-Volatile Memory Concept for Future Silicon Chips", Advance Online Publication, Mar. 13, 2005.

* cited by examiner

*Primary Examiner*—Davienne Monbleau
*Assistant Examiner*—Christopher M Roland
(74) *Attorney, Agent, or Firm*—Trop, Pruner & Hu, P.C.

(57) ABSTRACT

A phase change memory may be made of a chalcogenide material having a U-shape. The U-shaped chalcogenide may transition between amorphous and crystalline phases in an upper part of a vertical portion thereof. As a result, in some embodiments, self-heating may be achieved without the need for a heater, and without the need for glue in some cases.

14 Claims, 4 Drawing Sheets

PHASE CHANGE MEMORY WITH U-SHAPED CHALCOGENIDE CELL

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In accordance with some embodiments of the present invention, a non-planar or U-shaped chalcogenide material may be utilized to form a phase change memory. The U-shaped chalcogenide material may have a number of advantages including, in some embodiments, the ability to form the chalcogenide at sub-lithographic dimensions and, in any case, less than 180 nm. As used herein, sub-lithographic dimensions are dimensions smaller than are possible with lithographic techniques.

The thinner chalocogenide material may have the capacity to be heated more effectively. In some embodiments, a separate heater may not be needed as a result. In some embodiments, glue layers to adhere the chalcogenide to overlying and underlying layers may be avoided. In some embodiments, a relatively small contact can be made between the memory cell and a select or access device.

Figure 1:
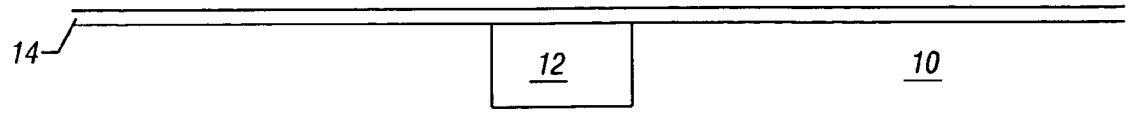
FIG. 1 is an enlarged, cross-sectional view at an early stage of manufacture in accordance with one embodiment of the present invention.

Referring to FIG. 1, initially, a row line 12 may be formed within an insulator 10. Over the row line 12 may be formed a nitride layer 14. In some embodiments, the row line 12 may conventionally be copper. The insulator 10 may overlie a semiconductor substrate (not shown). Conventionally, a metal that forms the row line 12 is deposited within a trench formed within the insulator 10. The insulator 10 may, for example, be an oxide. After the metal is deposited, it may be polished back so that its upper surface is coplanar with the upper surface of the insulator 10.

Figure 2:
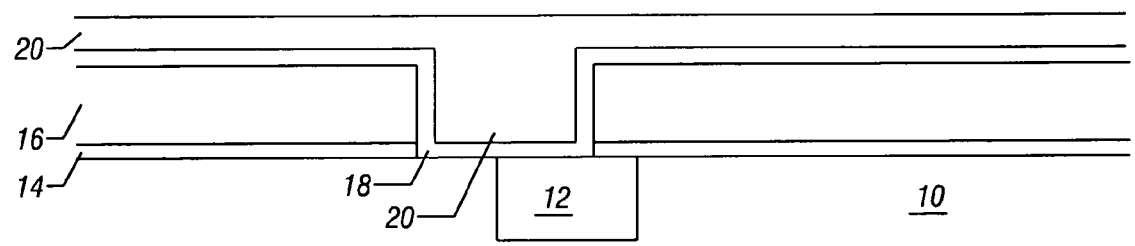
FIG. 2 is an enlarged, cross-sectional view at a subsequent stage of manufacture in accordance with one embodiment of the present invention.

Then, an insulating layer 14, which may be nitride in one embodiment, may be deposited. Next, another insulating layer 16 may be deposited over the layer 14 as shown in FIG. 2. The layer 16 may be an oxide. A trench may be formed through the layers 14 and 16.

Initially, the trench may be coated with a thin chalcogenide layer 18. The chalcogenide layer 18 may be of a sub-lithographic thickness since it may be merely blanket deposited in some embodiments. One example of a blanket deposition technique may be radio frequency sputter deposition. In some embodiments, the thickness of the layer 18 may be less than 20 nanometers and may be on the order of a few hundred Angstroms (e.g., 200 Angstroms) in some embodiments.

Then, the U-shaped or cup-shaped chalcogenide layer 18 may be covered with another insulating layer 20 which, in one embodiment, may be nitride. The layer 20 serves to electrically insulate the chalcogenide 18 between the layers 20 and 16. This may, in some embodiments, reduce heat loss.

Figure 3:
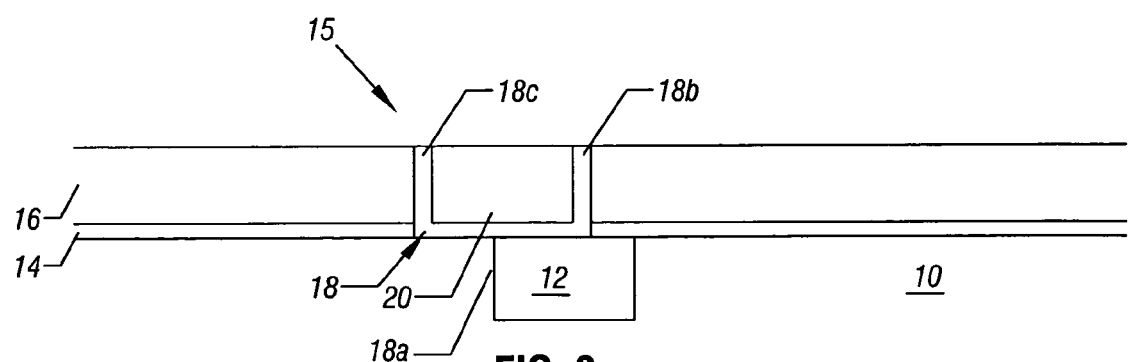
FIG. 3 is an enlarged, cross-sectional view at still a subsequent stage of manufacture in accordance with one embodiment of the present invention.

As shown in FIG. 3, the structure of FIG. 2 may be planarized to have a uniform, planar upper surface. As a result, the chalcogenide layer 18 is cup-shaped having a horizontal section 18a with peripheral upstanding portions 18b and 18c. The resulting structure forms an ovonic unified memory (OUM) memory element 15.

Figure 4:
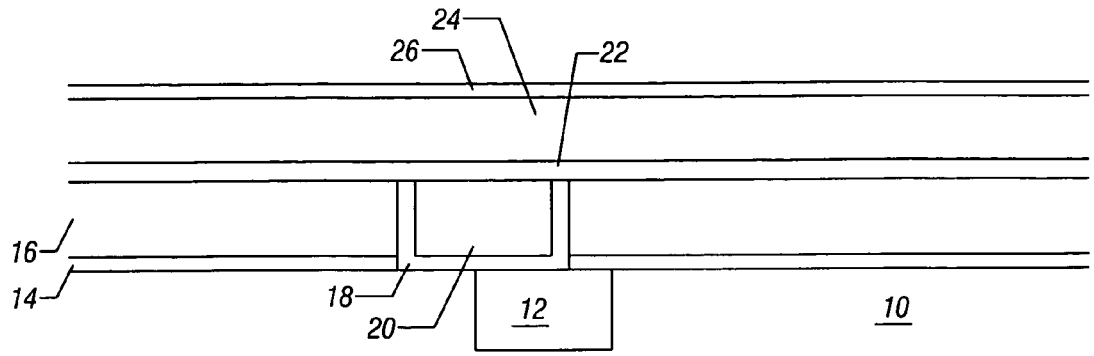
FIG. 4 is an enlarged, cross-sectional view at a subsequent stage of another embodiment of the present invention.

Turning next to FIG. 4, a conductive layer 22 may be deposited over the structure of FIG. 3, followed by a chalcogenide layer 24 and still another conductive layer 26. The layer 24 may be a chalcogenide that does not change phase and remains in the amorphous phase or state. The layers 22, 24, and 26 may form a threshold or access device such as an ovonic threshold switch (OTS) 25.

Figure 5:
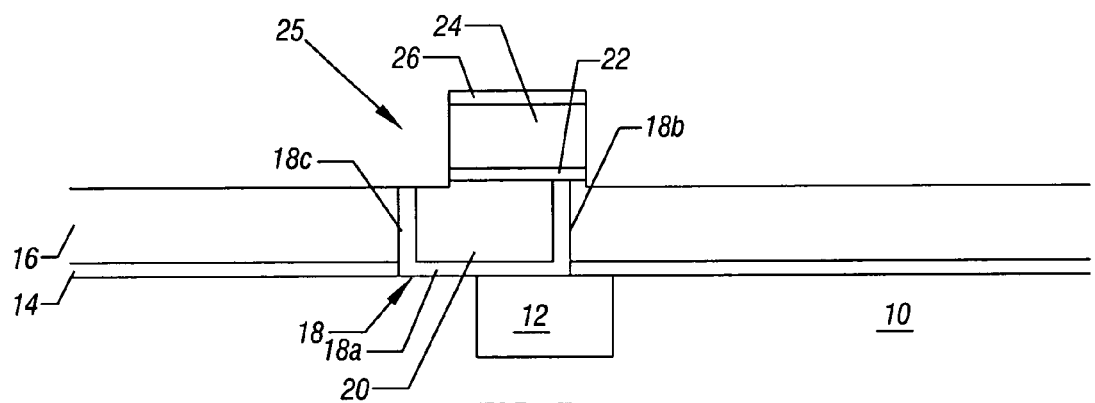
FIG. 5 is an enlarged, cross-sectional view at a subsequent stage in accordance with one embodiment of the present invention.

As shown in FIG. 5, the structure of FIG. 4 may be patterned and etched. As a result, a dot or island formed of layers 26, 24, and 22 may be defined to act as an OTS 25. Some slight undercutting into the layer 16 may occur during such etching as depicted in FIG. 5. As indicated in FIG. 5, the U-shaped chalcogenide layer 18 (forming the memory element 15), the row line 12, and the OTS 25 may be slightly offset from one another. However, it should be noted that a vertical portion 18b of the chalcogenide layer 18 contacts the conductive layer 22 of the resulting OTS 25.

The OTS 25 may be used to access memory element 15 during programming or reading of the memory element 15. An ovonic threshold switch is a select device that can be made of a chalcogenide alloy that does not exhibit an amorphous to crystalline phase change and which undergoes rapid, electric field initiated change in electrical conductivity that persists only so long as a holding voltage is present. OTS 25 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the OTS 25 is equal to its holding voltage $V_H$ plus I×Ron, where Ron is the dynamic resistance from $V_H$. For example, OTS 25 may have a threshold voltage and, if a voltage potential less than the threshold voltage of the OTS 25 is applied across the OTS 25, then the OTS 25 may remain "off" or in a relatively high resistive state so that little or no electrical current passes through the memory cell 15 and most of the voltage drop from selected row to selected column is across the OTS 25. Alternatively, if a voltage potential greater than the threshold voltage of OTS 25 is applied across OTS 25, then OTS 25 may "turn on," i.e., operate in a relatively low resistive state so that electrical current passes through the memory cell 15. In other words, OTS 25 may be in a substantially electrically nonconductive state if less than a predetermined voltage potential, e.g., the threshold voltage, is applied across OTS 25. OTS 25 may be in a substantially conductive state if greater than the predetermined voltage potential is applied across OTS 25.

In one embodiment, chalcogenide 24 may comprise a switching material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with its holding voltage) by application of a predetermined electrical current or voltage potential. In this embodiment, OTS 25 may be a two terminal device that may have a current-voltage (I-V) characteristic similar to a phase change memory element 15 that is in the amorphous state. However, unlike a phase change memory element 15, the chalcogenide 24 may not change phase. That is, the switching material of OTS 25 may not be a programmable material, and, as a result, OTS 25 may not be a memory device capable of storing information. For example, the switching material of OTS 25 may remain permanently amorphous and the I-V characteristic may remain the same throughout the operating life.

The chalcogenide 24 may include an alloy of arsenic (As), tellurium (Te), sulfur (S), germanium (Ge), selenium (Se), and antimony (Sb) with respective atomic percentages of 10%, 21%, 2%, 15%, 50%, and 2%. Although the scope of the present invention is not limited in this respect, in other embodiments, chalcogenide 24 may include Si, Te, As, Ge, sulfur (S), and selenium (Se). As another example, the composition of the chalcogenide 24 may comprise a Si concentration of about 5%, a Te concentration of about 34%, an As concentration of about 28%, a Ge concentration of about 11%, a S concentration of about 21%, and a Se concentration of about 1%.

Figure 6:
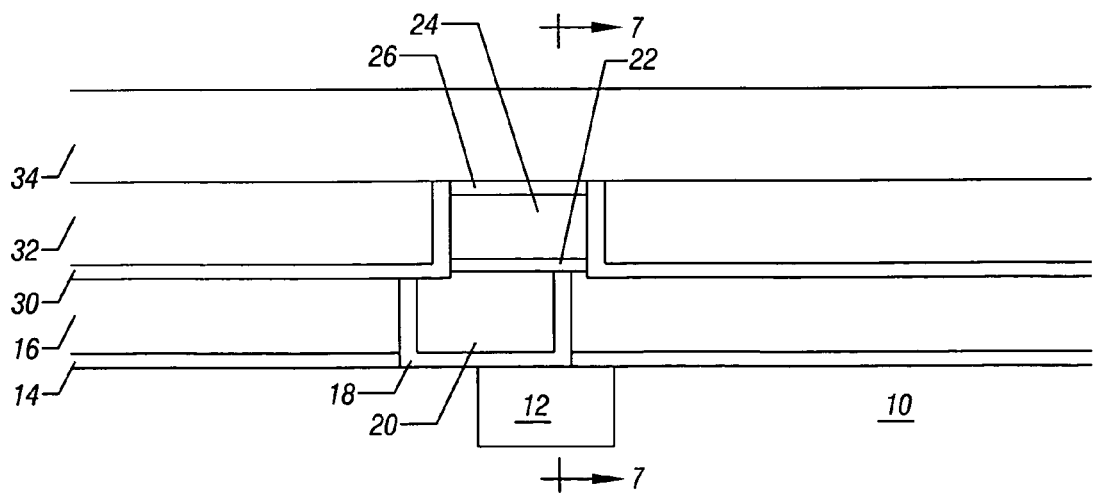
FIG. 6 is an enlarged, cross-sectional view at a subsequent stage in accordance with one embodiment of the present invention.

Referring to FIG. 6, the structure shown in FIG. 5 may be covered by an insulating layer 30, such as nitride, and still another insulating layer 32, such as oxide, and still another conductive layer 34 which may form a column line. Note that the column line 34 and the row line 12 extend transversely to one another in one embodiment.

Figure 7:
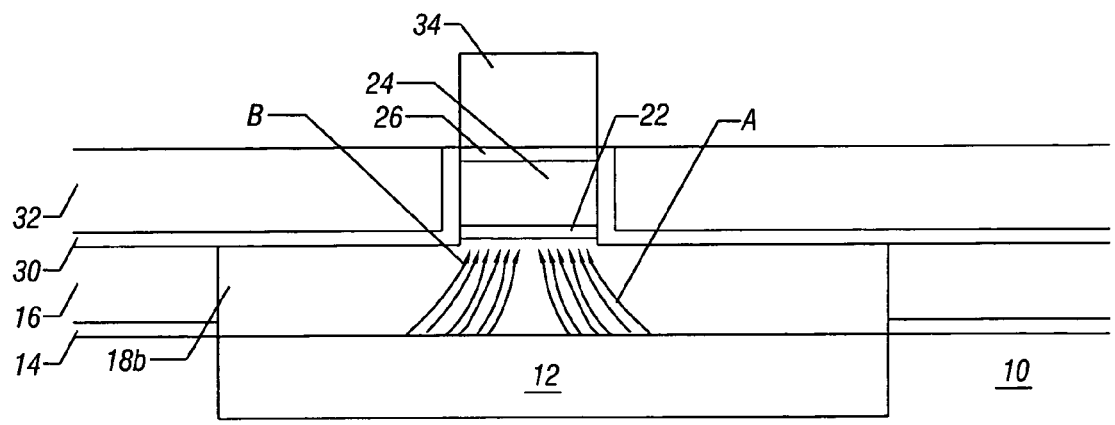
FIG. 7 is a cross-sectional view taken generally along the line 7-7 in FIG. 6 in accordance with one embodiment of the present invention.

As shown in FIG. 7, electrical current, represented by arrows, may proceed from the lower row line 12 to the upper column line 34. The current density is concentrated in the upper vertical portion B of the chalcogenide portion 18b. The increased current density at "B" arises because the extent of the conductive layer 22 is less than the extent of the chalcogenide vertical portion 18b in the direction depicted in FIG. 7 which is transverse to the direction of the column line 34 and parallel to the direction of the row line 12.

As a result, current from the row line 12 funnels into the narrow vertical portion 18b of the chalcogenide layer 18, concentrated by the narrowness of the vertical portion 18b in the direction of the column line 34. The current density is further concentrated at B by the reduced extent of the conductive layer 22 relative to the extent of the vertical portion 18b in the direction of the row line 12. This results in heating and phase change in the upper portion B of the vertical portion 18b of the chalcogenide layer 18. As a result, a relatively small amount of chalcogenide material is exposed to high current density to facilitate transitions between more crystalline and less crystalline phases.

In the low voltage or low electric field mode, i.e., where the voltage applied across OTS 25 is less than a threshold voltage OTS 25 may be "off" or nonconducting, and exhibit a relatively high resistance, e.g., greater than about 10 megaOhms. OTS 25 may remain in the off state until a sufficient voltage, e.g., $V_{TH}$, is applied, or a sufficient current is applied, e.g., $I_{TH}$, that may switch OTS 25 to a conductive, relatively low resistance on state. After a voltage potential of greater than about $V_{TH}$ is applied across OTS 25, the voltage potential across OTS 25 may drop ("snapback") to a holding voltage potential ($V_H$). Snapback may refer to the voltage difference between $V_{TH}$ and $V_H$ of a select device.

In the on state, the voltage potential across OTS 25 may remain close to the holding voltage as current passing through OTS 25 is increased. OTS 25 may remain on until the current through OTS 25 drops below a holding current. Below this value, OTS 25 may turn off and return to a relatively high resistance, nonconductive off state until the $V_{TH}$ and $I_{TH}$ are exceeded again.

Programming of chalcogenide layer 18 of the memory element 15 to alter the state or phase of the material may be accomplished by applying voltage potentials to conductive lines 12 and 34, thereby generating a voltage potential across OTS 25 and memory element 15. When the voltage potential is greater than the threshold voltage of OTS 25 and memory element 15, then an electrical current may flow through chalcogenide layer 18 in response to the applied voltage potentials, and may result in heating of memory material.

This heating may alter the memory state or phase of memory material. Altering the phase or state of memory material may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 8:
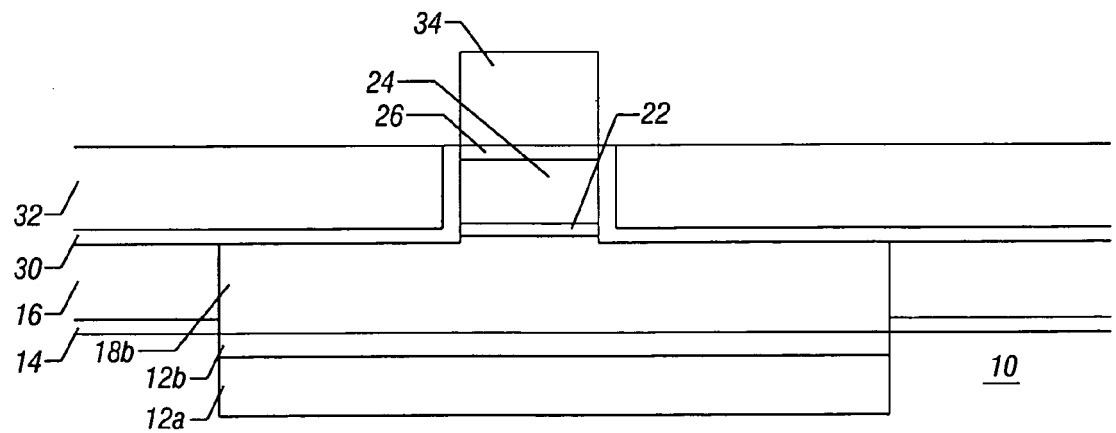
FIG. 8 is an enlarged, cross-sectional view at a subsequent stage in accordance with one embodiment of the present invention.

Referring to FIG. 8 in accordance with another embodiment of the present invention, an electrode material 12b may be situated over the row line 12a. The electrode 12b may be made of a material, such as titanium, to reduce any possible contamination of copper from the row line 12a into the chalcogenide layer 18. In one embodiment, copper may be deposited then polished back to form a recess in the copper row line 12a using a selective wet etch such as dilute sulfuric acid. The electrode material 12b may then be deposited and polished back. As a result, the material 12b serves to isolate the copper in the line 12a from the chalcogenide layer 18.

In other embodiments, the depth of the trench and, therefore, the height of the vertical portion 18b of the chalcogenide layer 18, may be increased to further isolate the portion B of the chalcogenide which changes phase, from the row electrode 12. This isolation reduces the adverse effect of any copper diffusion on the chalcogenide in the layer 18.

In some embodiments of the present invention, no heater is needed, at least partially due to the arrangement of the chalcogenide layer 18 in the memory element 15. In addition, because of the reduced contact between the chalcogenide layer 18 and the overlying OTS 25, glue layers may not be necessary. Thus, in some embodiments, the chalcogenide layer 18 is sufficiently thin, for example, sub-lithographic, that it is relatively easily heated. Since the current flowing through the chalcogenide layer 18 must flow through the height of chalcogenide layer 18 to the upper section B of the vertical portion 18b, where phase change occurs, self-heating may occur within the chalcogenide layer 18. Moreover, the current density that converts the upper portion B of the chalcogenide layer 18 is more concentrated, in some embodiments, because of the reduced extent of the OTS electrode 22.

For example, in some embodiments, the vertical portion 18b of the chalcogenide layer 18 reduces the extent of the chalcogenide layer 18a in the direction transverse to the direction of the row electrode 12. Then, as shown in FIG. 7, the smaller extent in the row direction of the lower conductive layer 22 of the threshold device 25 further concentrates the current in the region B where phase change may occur.

Thus, the need for a heater may be avoided in some embodiments, and self-heating may be utilized instead. Moreover, a relatively compact structure may be formed by virtual of the verticality of the portion 18b. The verticality of the portion 18b reduces the dimensions of the resulting cell, at least in a direction transverse to the height of the portion 18b.

In some embodiments of the present invention, the chalcogenide layer 18 is less than 500 Angstroms and may be on the order of 200 Angstroms in some embodiments. The fact that the vertical portion 18b may be well insulated reduces heat which may result in lower power consumption of the resulting memory in some embodiments.

Figure 9:
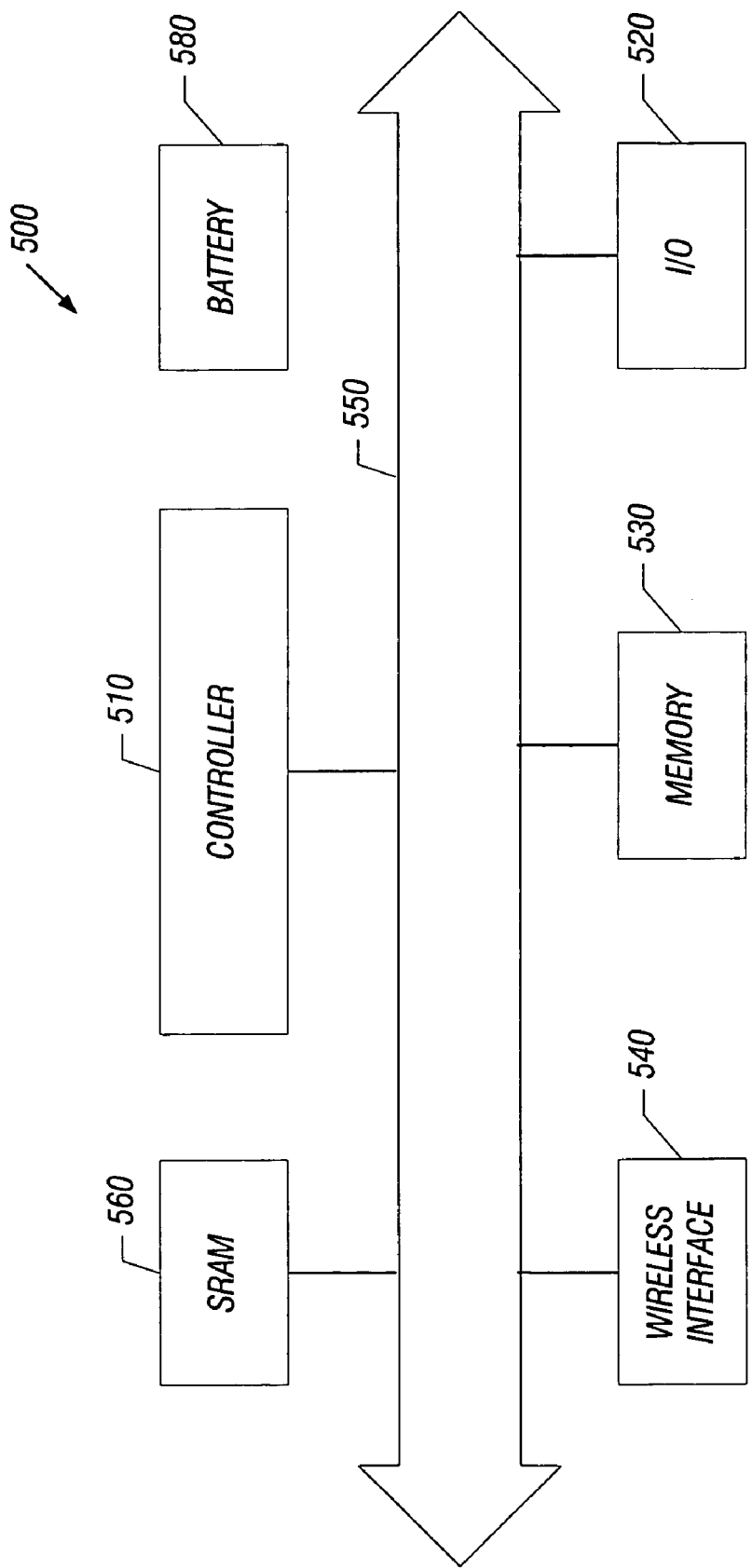
FIG. 9 is a system depiction for one embodiment of the present invention.

Turning to FIG. 9, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, a static random access memory (SRAM) 560, and a wireless interface 540 coupled to each other via a bus 545. The system 500 may be powered by the battery 580. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a chalcogenide layer having a U-shape including a horizontal portion and two upstanding vertical portions coupled to said horizontal portion, only one of said vertical portions to conduct current through said memory;
   a bottom electrode beneath said horizontal portion and electrically coupled to said horizontal portion; and
   a top electrode over said chalcogenide layer and electrically coupled to only one of said vertical portions to establish only a single current path through said chalcogenide layer.

2. The memory of claim 1 including a memory element including said chalcogenide layer having a U-shape and an access device.

3. The memory of claim 2 wherein said access device is an ovonic threshold switch.

4. The memory of claim 3 wherein said ovonic threshold switch includes an upper electrode and a chalcogenide material between said upper electrode and said top electrode, said top electrode being in contact with said chalcogenide material and said chalcogenide material does not change phase.

5. The memory of claim 1 wherein said chalcogenide layer is cup-shaped and is filled with an insulator.

6. The memory of claim 1 wherein said chalcogenide layer has a thickness of less than 200 nanometers.

7. The memory of claim 1 wherein said memory does not include a heater.

8. A system comprising:
   a controller and
   a semiconductor phase change memory including a U-shaped chalcogenide layer including a horizontal portion and two upstanding vertical portions coupled to said horizontal portion, only one of said vertical portions to conduct current through said memory, a bottom electrode beneath said horizontal portion and electrically coupled to said horizontal portion, and a top electrode over said chalcogenide layer and electrically coupled to only one of said vertical portions, said chalcogenide layer having only a single current path.

9. The system of claim 8 including a memory element and an access device.

10. The system of claim 9 wherein said access device is an ovonic threshold switch.

11. The system of claim 9 wherein said access device does not change phase and includes a chalcogenide material.

12. The system of claim 8 wherein said chalcogenide layer is cup-shaped and is filled with an insulator.

13. The system of claim 8 wherein said chalcogenide layer has a thickness less than 200 nanometers.

14. The system of claim 8 wherein said memory does not include a heater.

* * * * *